(12) United States Patent
Putnam et al.

(10) Patent No.: US 9,530,912 B2
(45) Date of Patent: Dec. 27, 2016

(54) THREE-DIMENSIONAL PATTERNING METHODS AND RELATED DEVICES

(75) Inventors: Morgan C. Putnam, Pasadena, CA (US); Michael D. Kelzenberg, Pasadena, CA (US); Harry A. Atwater, South Pasadena, CA (US); Shannon W. Boettcher, Eugene, OR (US); Nathan S. Lewis, La Canada, CA (US); Joshua M. Spurgeon, Pasadena, CA (US); Daniel B. Turner-Evans, Pasadena, CA (US); Emily L. Warren, Pasadena, CA (US)

(73) Assignee: The California Institute of Technology, Pasadena, CA (US)

(*) Notice: Subject to any disclaimer, the term of this patent is extended or adjusted under 35 U.S.C. 154(b) by 1199 days.

(21) Appl. No.: 12/956,422

(22) Filed: Nov. 30, 2010

(65) Prior Publication Data

US 2011/0126892 A1 Jun. 2, 2011

Related U.S. Application Data

(60) Provisional application No. 61/265,297, filed on Nov. 30, 2009, provisional application No. 61/265,306, (Continued)

(51) Int. Cl.
*H01L 31/0232* (2014.01)
*H01L 31/0236* (2006.01)
*H01L 31/052* (2014.01)
*H01L 31/0224* (2006.01)
*H01L 31/068* (2012.01)
(Continued)

(52) U.S. Cl.
CPC ............ *H01L 31/035281* (2013.01); *H01L 31/022425* (2013.01); *H01L 31/056* (2014.12); *H01L 31/0547* (2014.12); *H01L 31/068* (2013.01); *H01L 31/1804* (2013.01); *Y02E 10/52* (2013.01); *Y02E 10/547* (2013.01); *Y02P 70/521* (2015.11)

(58) Field of Classification Search
CPC ............... H01L 31/035281; H01L 31/0522; H01L 31/0527; H01L 31/068; H01L 31/1804; H01L 31/035227; H01L 31/0352
See application file for complete search history.

(56) References Cited

U.S. PATENT DOCUMENTS 4,358,676 A  11/1982  Childs
5,314,569 A   5/1994  Pribat
(Continued)

FOREIGN PATENT DOCUMENTS

CN     1669920 A    9/2005
CN     1808688 A    7/2006
(Continued)

OTHER PUBLICATIONS

Plass et al "Flexible Polymer-Embedded Si wire Arrays", Advanced Materials, 21, 325-328. published online Nov. 14, 2008.*
(Continued)

*Primary Examiner* — Marla D McConnell
(74) *Attorney, Agent, or Firm* — Joseph R. Baker, Jr.; Gavrilovich, Dodd & Lindsey LLP

(57) ABSTRACT

Three-dimensional patterning methods of a three-dimensional microstructure, such as a semiconductor wire array, are described, in conjunction with etching and/or deposition steps to pattern the three-dimensional microstructure.

21 Claims, 9 Drawing Sheets

Related U.S. Application Data filed on Nov. 30, 2009, provisional application No. 61/313,654, filed on Mar. 12, 2010.

(51) Int. Cl.
| | |
|---|---|
| H01L 31/0352 | (2006.01) |
| H01L 31/18 | (2006.01) |
| H01L 31/056 | (2014.01) |
| H01L 31/054 | (2014.01) |

(56) References Cited

U.S. PATENT DOCUMENTS

| | | | |
|---|---|---|---|
| 5,336,558 A | 8/1994 | Debe | |
| 5,352,651 A | 10/1994 | Debe | |
| 5,656,098 A * | 8/1997 | Ishikawa et al. | 136/256 |
| 5,976,957 A | 11/1999 | Westwater et al. | |
| 6,306,734 B1 | 10/2001 | Givargizov | |
| 6,518,494 B1 | 2/2003 | Shibuya et al. | |
| 6,649,824 B1 | 11/2003 | Den | |
| 7,057,881 B2 | 6/2006 | Chew et al. | |
| 7,105,428 B2 | 9/2006 | Pan et al. | |
| 7,109,517 B2 | 9/2006 | Zaidi | |
| 7,116,546 B2 | 10/2006 | Chew et al. | |
| 7,148,417 B1 | 12/2006 | Landis | |
| 7,238,594 B2 | 7/2007 | Fenash et al. | |
| 7,253,017 B1 | 8/2007 | Roscheisen et al. | |
| 7,253,442 B2 | 8/2007 | Huang et al. | |
| 7,309,620 B2 | 12/2007 | Fonash et al. | |
| 7,335,259 B2 | 2/2008 | Hanrath et al. | |
| 7,560,366 B1 | 7/2009 | Romano et al. | |
| 7,666,708 B2 | 2/2010 | Lieber et al. | |
| 2002/0172820 A1 | 11/2002 | Majumdar et al. | |
| 2004/0213307 A1 | 10/2004 | Lieber et al. | |
| 2005/0098204 A1 | 5/2005 | Roscheisen et al. | |
| 2005/0253138 A1 | 11/2005 | Choi et al. | |
| 2005/0279274 A1 | 12/2005 | Niu et al. | |
| 2006/0118791 A1 | 6/2006 | Leu et al. | |
| 2006/0207647 A1 * | 9/2006 | Tsakalakos et al. | 136/256 |
| 2007/0032076 A1 | 2/2007 | Lee et al. | |
| 2007/0122313 A1 | 5/2007 | Li et al. | |
| 2007/0166899 A1 | 7/2007 | Yao et al. | |
| 2007/0232028 A1 | 10/2007 | Lee et al. | |
| 2007/0278476 A1 | 12/2007 | Black | |
| 2008/0006319 A1 | 1/2008 | Bettge et al. | |
| 2008/0047604 A1 | 2/2008 | Korevaar et al. | |
| 2008/0072961 A1 | 3/2008 | Liang et al. | |
| 2008/0075954 A1 | 3/2008 | Wardle et al. | |
| 2008/0110486 A1 | 5/2008 | Tsakalakos et al. | |
| 2008/0134089 A1 | 6/2008 | Adachi et al. | |
| 2008/0169017 A1 | 7/2008 | Korevaar et al. | |
| 2008/0276987 A1 | 11/2008 | Flood | |
| 2008/0315430 A1 | 12/2008 | Weber et al. | |
| 2009/0020150 A1 | 1/2009 | Atwater et al. | |
| 2009/0020853 A1 | 1/2009 | Kayes et al. | |
| 2009/0050204 A1 | 2/2009 | Habib | |
| 2009/0057839 A1 | 3/2009 | Lewis et al. | |
| 2009/0127540 A1 | 5/2009 | Taylor | |
| 2009/0152527 A1 | 6/2009 | Lee et al. | |
| 2009/0266411 A1 | 10/2009 | Habib et al. | |
| 2010/0108131 A1 | 5/2010 | Guha et al. | |
| 2010/0175748 A1 * | 7/2010 | Karg | 136/256 |
| 2011/0096218 A1 | 4/2011 | Bratkovski et al. | |

FOREIGN PATENT DOCUMENTS

| | | |
|---|---|---|
| JP | 6-508678 | 9/1994 |
| JP | 11-214720 | 8/1999 |
| JP | 2000-269561 | 9/2000 |
| JP | 2001-135516 | 5/2001 |
| JP | 2004-152787 | 5/2004 |
| JP | 2005-310388 | 4/2005 |
| JP | 2005-310821 | 4/2005 |
| JP | 2005-194609 | 7/2005 |
| JP | 2005-111200 | 10/2005 |
| KR | 10-2007-18457 | 2/2007 |
| KR | 10-2008-0044181 A | 5/2008 |
| WO | 93/00560 | 1/1993 |
| WO | 03/005450 A2 | 1/2003 |
| WO | 2006/138671 A2 | 12/2006 |
| WO | 2008/135905 A2 | 11/2008 |
| WO | 2009/012459 A2 | 1/2009 |

OTHER PUBLICATIONS

Garnett and Yang, "Silicon Nanowire Radial p-n Junction Solar Cells", JACS, 130, 9224-9225. published online Jun. 25, 2008.*
Bierman and Jin, "Potential applications of hierchical branching nanowires in solar energy", Energy Environ. Sci., 2009, 1050-1059.*
pveducation.org, "optical properties of silicon", accessed Jan. 10, 2014.*
Maiolo, et al "High Aspect ratio silicon wire array photoelectrochemical cells", JACS, 2007, p. 12346-12347.*
Altermatt, P., et al., Simulation of optical properties of Si wire cells, $34^{th}$ IEEE Photovoltaic Specialists Conference 2009, 000972-000977.
Aspnes, D.E., Optical properties of c-Si: general aspects in Optical properties 1999, chapter 12, 677, 679-697.
Kayes, B., et al., Comparison of the device physics principles of planar and radial p-n junction nanorod solar cells, Journal of Applied Physics 2005, 97: 114302-1-114302-11.
Kayes, B. et al., Growth of vertically aligned Si wire arrays over large areas (>1cm2) with Au and Cu catalysts, Applied Physics Letters 2007, 91: 103110-1-103110-3.
Kelzenberg, M., et al., Single-nanowire Si solar cells, $33^{rd}$ IEEE Photovoltaic Specialists Conference 2008, 1-6.
Kelzenberg, M., et al., Predicted efficiency of Si wire array solar cells, $34^{th}$ IEEE Photovoltaic Specialists Conference 2009, 001948-001953.
Marion, B., et al., Validation of a photovoltaic module energy ratings procedure at NREL, NREL Technical Report 1999, NREL/TP-520-26909 1-48.
Marion, B., et al., Validation of a photovoltaic module energy ratings procedure at NREL, NREL Technical Report 1999, NREL/TP-520-26909 49-97.
Putnam, M., et al., 10 um minority-carrier diffusion lengths in Si wires synthesized by Cu-catalyzed vapor-liquidsolid growth, Applied Physics Letters 2009, 95: 163116-1-163116-3.
Tiedje, T., et al., Limiting efficiency of silicon solar cells, IEEE Transactions on Electron Devices 1984, ED-31: 711-716.
Yablonovitch, E., et al., Unusually low surface-recombination velocity on silicon and germanium surfaces, Physical Review Letters 1986, 57: 249-252.
Yablonovitch, E., Statistical ray optics, Journal of the Optical Society of America 1982, 72: 899-907.
Hopkins et al., "Impurity Effects in Silicon for High Efficiency Solar Cells", Journal of Crystal Growth 75 (1986) 67-79.
Hu et al., "Analysis of Optical Absorption in Silicon Nanowire Arrays for Photovoltaic Applications", Nano Letters, vol. 7, No. 11, Nov. 2007, 3249-3252.
Huang et al., "Microstructured silicon protector", Applied Physics Letters, 89, 033506.1-033506.3, 2006.
Huang et al., "Fabrication of Silicon Nanowire Arrays with Controlled Diameter, Length, and Density", Advanced Materials, 19, 744 (2007).
Huynh et al., "Hybrid Nanorod-Polymer Solar Cells", Science, 295, 2425 (2002).
Ismail et al., "Hydrogen Gas Production for Electronic-Grade Polycrystalline Silicon Growth", IEEE ICSE, 2002, 53-56.
Jacoboni et al., "A Review of Some Charge Transport Properties of Silicon", Solid State Electronics, 1977, vol. 20, 77-891.
Jenny et al., "Semiconducting Cadmium Telluride", Physical Review, vol. 96, No. 5, Dec. 1, 1954, 1190-1191.
Jung et al., "Aligned Carbon Nanotube-Polymer Hybrid Architectures for Diverse Flexible Electronic Applications", Nano Letters, 2006, vol. 6, No. 3, pp. 413-418.

(56) References Cited

OTHER PUBLICATIONS

Kang et al., "Hybrid solar cells with vertically aligned CdTe nanorods and a conjugated polymer", Applied Physics Letters, 86, 113101-1-113101-3 (2005).
Kang et al., "Well-aligned CdS nanorod/conjugated polymer solar cells", Solar Energy Materials & Solar Cells, 90 (2006) 166-174.
Kawano et al., "Fabrication and properties of ultrasmall Si wire arrays with circuits by vapor-liquid-solid growth", Sensors and Actuators, A 97-98 (2002) 709-715.
Kayes et al., "Radial PN Junction Nanorod Solar Cells: Device Physics Principles and Routes to Fabrication in Silicon", IEEE PVSC, 2005, pp. 55-58.
Kayes et al., "Synthesis and Characterization of Silicon Nanorod Arrays for Solar Cell Applications", IEEE WCPEC, 2006, 1, 221-224.
Kayes et al., "Growth of vertically aligned Si wire arrays over large areas (>1cm2) with Au and Cu Catalysts", Supplementary Material, App. Phys. Letter, 91, 103110 (2007).
Keevers et al., "Efficiency Improvements of Silicon Solar Cells by the Impurity Photovoltaic Effect", IEEE 1993, Photovoltaic Specialists Conference, 140-146.
Kelzenberg et al., "Photovoltaic Measurements in Single-Nanowire Silicon Solar Cells", Nano Letters, 2008, vol. 8, No. 2, pp. 710-714.
Kelzenberg et al., "Enhanced absorption and carrier collection in Si wire arrays for photovoltaic applications", Nature Materials, 2010, 9:239-244.
Kempa et al., "Single and Tandem Axial p-i-n Nanowire Photovoltaic Devices", Nano Letters, 2008, vol. 8, No. 10, 3456-3460.
Kim et al. "Photovoltaic Properties of Nano-particulate and Nanorod Array ZnO Electrodes for Dye-Sensitized Solar Cell", Bull. Korean Chem. Soc., vol. 27, No. 2, 295-298, Feb. 2006.
Kim et al., "Stretchable and Foldable Silicon Integrated Circuits", Science, 2008, 320, 507-511.
Kim, Min Soo, International Search Report and Written Opinion issued in PCT/US2010/058422, Korean Intellectual Property Office, Date of Mailing: Sep. 16, 2011.
Klein et al., "Electrochemcial Fabrications of Cadmium Chalcogenide Microdiode Arrays", Chem. Mater., 1993, 5, 902-904.
Kressin et al., "Synthesis of Stoichiometric Cadmium Selenide Films via Sequential Monolayer Electrodeposition", Chem. Mater., 1991, 3, 1015-1020.
Kupec et al., "Dispersion, Wave Propagation and Efficiency Analysis of Nanowire Solar Cells," Optical Express, 2009, 17:10399-10410.
Lauhon et al., "Epitaxial core-shell and core-multishell nanowire heterostructures", Nature, vol. 420, Nov. 7, 2002, pp. 57-61.
Law et al., "Semiconductor Nanowires and Nanotubes", Annu. Rev. Mater. Res., 2004, 34:83-122.
Law et al., "Nanowire dye-sensitized solar cells", Nat. Mater., 2005, 4, 455-459.
Lee et al., "Solvent Compatibility of Poly(dimethylsiloxane)-Based Microfluidic Devices", Anal. Chem., 2003, 75, 6544-6554.
Lepiller et al., "New Facets of CdTe Electrodeposition in Acidic Solutions with Higher Tellurium Concentrations", Journal of the Electrochemical Society, 151 (5) C348-C357, 2004.
Lin et al., "Efficient photoinduced charge transfer in TiO2 nanorod/conjugated polymer hybrid materials", Nanotechnology, 17 (2006), 5781-5785.
Lindner, Nora, International Preliminary Report on Patentability issued in PCT/US2010/058422, The International Bureau of WIPO, Date of Mailing: Jun. 14, 2012.
Lombardi et al., "Synthesis of High Density, Size-Controlled Si Nanowire Arrays via Porous Anodic Alamina Mask", Chem. Mater., 2006, 18, 988-991.
Lopatiuk-Tirpak et al., "Studies of minority carrier transport in ZnO", Superlattices and Microstructures, 42 (2007), 201-205.
Maiolo et al., "High Aspect Ratio Silicon Wire Array Photoelectrochemical Cells", J. Am. Chem. Soc., 129, 2007, 12346-12347.
Maiolo et al., "Macroporous Silicon as a Model for Silicon Wire Array Solar Cells", J. Phys. Chem. C 2008, 112, 6194-6201.
Martensson et al., "Fabrication of individually seeded nanowire arrays by vapour-liquid-solid growth", Nanotechnology, 14 (2003) 1255-1258.
Mccandless et al., "Cadmium Telluride Solar Cells", In Handbook of Photovoltaic Science and Engineering, 2003, pp. 617-657.
Mcdonald et al., "Poly(dimethylsiloxane) as a Material for Fabricating Microfluidic Devices", Acc. Chem. Res., 2002, 35 (7), 491-499.
Meissner et al., "Light-Induced Generation of Hydrogen at CdS-Monograin Membranes", Chemical Physics Letters, vol. 96, No. 1, Mar. 25, 1983, pp. 34-37.
Mohan et al., "Controlled growth of highly uniform, axial/radial direction-defined, individually addressable InP nanowire arrays", Nanotechnology 16 (2005) 2903-2907.
Morales et al., "A Laser Ablation Method for the Synthesis of Crystalline Semiconductor Nanowires", Science, 79, 208-211 (1998).
Morin et al., "Biomimetic Assembly of Zinc Oxide Nanorods onto Flexible Polymers", J. Am. Chem. Soc., 2007, 129 (45), 13776-13777.
Muskens et al., "Design of Light Scattering in Nanowire Materials for Photovoltaic Applications", Nano Letters, 2008, vol. 8, No. 9, 2638-2642.
Oh, Je Uk, Search Report and Written Opinion issued in PCT/US2011/029663, Korean Intellectual Property Office, Date of Mailing: Jan. 10, 2012.
Park, Jae Hun, Search Report for PCT/US2008/070495, Korean Intellectual Property Office, Date of Mailing: Feb. 20, 2009.
Park, Jae Hun, Written Opinion for PCT/US20081070495, Korean Intellectual Property Office, Date of Mailing: Feb. 20, 2009.
Park, Jae Hun, Search Report for PCT/US2008/070523, Korean Intellectual Property Office, Date of Mailing: Feb. 20, 2009.
Park, Jae Hun, Written Opinion for PCT/US2008/070523, Korean Intellectual Property Office, Date of Mailing: Feb. 20, 2009.
Park, Jae Hun, Search Report for PCT/US2008/070518, Korean Intellectual Property Office, Date of Mailing: Feb. 20, 2009.
Yu et al., "Silicon Nanowires: Preparation, Device Fabrication, and Transport Properties", J. Phys. Chem. B 2000, 104, 11864-11870.
Yu et al., "Large-area blown bubble films of aligned nanowires and carbon nanotubes", Nat. Nanotechnol., 2007, 2 (6) 372-377.
Zach et al., "Synthesis of Molybdenum Nanowires with Millimeter-Scale Lengths Using Electrochemical Step Edge Decoration", Chem. Mater. 2002, 14, 3206-3216.
Zhu et al., "Optical Absorption Enhancement in Amorphous Silicon Nanowire and Nanocone Arrays", Nano Letters, 2009, vol. 9, No. 1, 279-282.
Office Action issued in Japanese Patent Application No. 2010-522999, Mar. 5, 2013.
Office Action issued in Chinese Patent Application No. 200880107746.5, Sep. 27, 2011.
Office Action issued in Chinese Patent Application No. 20080102837.X, Oct. 9, 2011.
Amra, C., "From light scattering to the microstructure of thin-film multilayers", Applied Optics, vol. 32, No. 28, p. 5481 (1993).
Anandan et al., "Room temperature growth of CuO nanorod arrays on copper and their application as a cathode in dye-sensitized solar cells", Materials Chemistry and Physics, 93 (2005), 35-40.
Anandan, Sambandam, "Recent improvements and arising challenges in dye-sensitized solar cells", Solar Energy Materials & Solar Cells, 91 (2007) 843-846.
Aspnes, D.E., "Optical functions of intrinsic c-Si for photon energies up to 7.5 eV: table", Properties of Crystalline Silicon, 1999, 683-690.
Baharlou, Simin, International Preliminary Report on Patentability issued in PCT/US2011/029663, The International Bureau of WIPO, Date of Mailing: Oct. 4, 2012.
Balakrisnan et al., "Patterning PDMS using a combination of wet and dry etching", J. Micromech. Microeng., 19 (2009) 047002.1-047002.7.
Basol et al., "Ultra-Thin Electrodeposited CdS/CdTe Heterojunction with 8% Efficiency", IEEE Photo. Spec. Conf., 1982, 805-808.

(56) References Cited

OTHER PUBLICATIONS

Basol, B., "High-efficiency electroplated heterojunction solar cell", J. Appl. Phys. 55(2), 1984, pp. 601-603.
Basol, B., "Thin Film CdTe Solar Cells—A Review", Conf. Rec. IEEE Photo. Spec. Conf., 1990, 588-594.
Bhattacharya et al., "Electrodeposition of CdTe Thin Films", 1984, 131, 2032-2041.
Boettcher, Shannon W. et al., "Energy-Conversion Properties of Vapor-Liquid-Solid-Grown Silicon Wire-Array Photocathodes", Science, 2010, 327:185-187.
Bogart et al., "Diameter-Controlled Synthesis of Silicon Nanowires Using Nanoporous Alumina Membranes", Adv. Mater 2005, 17 (1), 114-117.
Brown et al., "Impurity photovoltaic effect: Fundamental energy conversion efficiency limits", Journal of Applied Physics, vol. 92, No. 3, 2002, 1329-1336.
Bullis, W.M., "Properties of Gold in Silicon", Solid-State Electronics, Pergamon Press, 1966, vol. 9, pp. 143-168.
Campbell et al., "The Limiting Efficiency of Silicon Solar Cells under Concentrated Sunlight", IEEE Transactions on Electron Devices, vol. ED-33, No. 2, 1986, 234-239.
Choi, Jeong Yoon, Search Report for PCT/US2008/070509, Korean Intellectual Property Office, Date of Mailing: Feb. 20, 2009.
Choi, Jeong Yoon, Written Opinion for PCT/US2008/070509, Korean Intellectual Property Office, Date of Mailing: Feb. 20, 2009.
Chu et al., "Large Area Polycrystalline Silicon Solar Cells on Unidirectionally Solidified Acid-Treated Metallurigcal Grade Silicon", Proc. IEEE Southeastcon, 1989, 1436-1441.
Colombo et al., "Gallium arsenide p-i-n radial structures for photovoltaic applications", Applied Physics Letters, 94, 2009, 173108-1-173108-3.
Davis, Jr. et al., "Impurities in Silicon Solar Cells", IEEE Transactions on Electron Devices, vol. ED-27, No. 4, Apr. 1980, 677.
de Dood, Michiel Jacob Andries, "Silicon photonic crystals and spontaneous emission", Thesis, Utrecht University, 2002.
Dong et al., "Coaxial Group III—Nitride Nanowire Photovoltaics", Nano Letters, 2009, vol. 9, No. 5, 2183-2187.
Erts et al., "High Density Germanium Nanowire Assemblies: Contact Challenges and Electrical Characterization", J. Phys. Chem. B2006, 110, 820-826.
Fan et al., "Semiconductor Nanowires: From Self-Organization to Patterned Growth", Small 2(6), 700-717 (2006).
Fan et al., "Well-ordered ZnO nanowire arrays on GaN substrate fabricated via nanosphere lithography", Journal of Crystal Growth, 287 (2006) 34-38.
Fan et al., "Three-dimensional nanonpillar-array photovoltaics on low-cost and flexible substrates", Nature Mater., 2009, 8:648-653.
Fang et al., "Long Germanium Nanowires Prepared by Electrochemical Etching", Nano Letters, 2006, vol. 6, No. 7, 1578-1580.
Forouhi et al., "Optical dispersion relations for amorphous semiconductors and amorphous dielectrics", Physical Review B, vol. 34, No. 10, 1986, 7018-7026.
Fulop et al., "High-efficiency electrodeposited cadmium telluride solar cells", Appl. Phys. Lett., 1982, 40, 327-328.
Garnett et al., "Light Trapping in Silicon Nanowire Solar Cells", Nano Letters, 2010, 10:1082-1087.
Gibbons et al., "A 14% efficient nonaqueous semiconductor/liquid junction solar cell", Appl. Phys. Lett., 1984, 45, 1095-1097.
Givargizov, "Growth of Whiskers from the Vapor Phase", Highly Anisotropic Crystals, D. Reidel, Dordrecht, Holland, 1987, p. 169.
Goodey et al., "Silicon Nanowire Array Photoelectrochemical Cells", J. Am. Chem. Soc., 2007, 129 (41), 12344-12345.
Goto et al., "Molecular Nanojet in Water", Applied Phys. Express, 2 (2009) 035004-1-035004-2.
Goto et al., "Growth of Core-Shell InP Nanowires for Photovoltaic Application by Selective-Area Metal Organic Vapor Phase Epitaxy", Applied Physics Express 2 (2009) 035004-1-035004-3.
Gowrishankar et al., "Fabrication of densely packed, well-ordered, high-aspect-ratio silicon nanopillars over large areas using block copolymer lithography", Thin Solid Films, 2006, 513, 289-294.
Gronet et al., "n-Type silicon photoelectrochemistry in methanol: Design of a 10.1% efficient semiconductor/liquid junction solar cell", Proc. Natl. Acad. Sci. USA, vol. 80, pp. 1152-1156, Feb. 1983.
Gstrein et al., "Effects of Interfacial Energetics on the Effective Surface Recombination Velocity of Si/Liquid Contacts", J. Phys. Chem., B2002, 106, 2950-2961.
Gu et al., "Quantitative Measurement of the Electron and Hole Mobility-Lifetime Products in Semiconductor Nanowires", Nano Letters, 2006, vol. 6, No. 5, 948-952.
Gunawan et al., "Characteristics of vapor-liquid-solid grown silicon nanowire solar cells", Solar Energy Materials & Solar Cells, 93 (2009) 1388-1393.
Guo, L. Jay, "Nanoimprint Lithography: Methods and Material Requirements", Advanced Materials, 19, 495-513, 2007.
Guttler, G. et al., "Photovoltaic Effect of Gold in Silicon", J. Appl. Phys., 1969, 40:4994-4995.
Guttler, G. et al., "Impurity Photovoltaic Effect in Silicon", Energy Conversion, 1970, 10:51-55.
Haick et al., "Electrical Characteristics and Chemical Stability of Non-Oxidized, Methyl-Terminated Silicon Nanowires", J. Am. Chem. Soc., 2006, 128, 8990-8991.
Harris et al., "Semiconductors for Photoelectrolysis", Ann Rev. Mater. Sci., 1978, 8:99-134.
Haxel et al., "Rare Earth Elements—Critical Resources for High Technology", U.S. Geological Survey Fact Sheet, 087-02, 2002, p. 3.
Hochbaum et al., "Controlled Growth of Si Nanowire Arrays for Device Integration", Nano Letters, 2005, vol. 5, No. 3, 457-460.
Park, Jae Hun, Written Opinion for PCT/US2008/070518, Korean Intellectual Property Office, Date of Mailing: Feb. 20, 2009.
Paulson et al., "Spectroscopic ellipsometry investigation of optical and interface properties of CdTe films deposited on metal foils", Solar Energy Materials & Solar Cells, 82 (2004) 279-90.
Peng et al., "Fabrication of Large-Area Silicon Nanowire p-n Junction Diode Arrays", Adv. Mater., 2004, 16 (1), 73-76.
Peng et al., "Aligned Single-Crystalline Si Nanowire Arrays for Photovoltaic Applications", Small, 2005, 1, 1062-1067.
Pushparaj et al., "Flexible energy storage devices based on nanocomposite paper", PNAS, Aug. 21, 2007, vol. 104, No. 34, pp. 13574-13577.
Putnam et al., "Secondary Ion Mass Spectrometry of Vapor-Liquid-Solid Grown, Au-Catalyzed, SiWires", Nano Letters, 2008, vol. 8, No. 10, 3109-3113.
Raravikar et al., "Embedded Carbon-Nanotube-Stiffened Polymer Surfaces", Small, 1 (3), 317 (2005).
Ray, Jayati, First Office Action, Australian Patent Office, Application No. 2008275878, Nov. 14, 2012.
Rosenbluth et al., "630-mV open circuit voltage, 12% efficient n-Si liquid junction", Appl. Phys. Lett, 1985, 45, 423-425.
Rosenbluth et al., "Kinetic Studies of Carrier Transport and Recombination at the n-Silicon/Methanol Interface", Journal of the American Chemical Society, vol. 108, No. 16, Aug. 6, 1986, pp. 4689-4695.
Rosenbluth et al., "'Ideal' Behavior of the Open Circuit Voltage of Semiconductor/Liquid Junctions", 1989, 93, 3735-3740.
Routkevitch et al., "Electrochemical Fabrication of CdS Nanowire Arrays in Porous Anodic Aluminum Oxide Templates", J. Phys. Chem. 1996, 100, 14037-14047.
Routkevitch et al., "Nonlithographic Nano-Wire Arrays: Fabrication, Physics, and Device Applications", IEEE Transactions on Electron Devices, vol. 43, No. 10, 1996, pp. 1646-1658.
Sah et al., "Recombination Properties of the Gold Acceptor Level in Silicon using the Impurity Photovoltaic Effect", Phys. Rev. Lett., 1967, 40:71-72.
Sansom et al., "Controlled partial embedding of carbon nanotubes within flexible transparent layers", Nanotechnology, 19, 035302 (2008).
Sayad et al., "Determination of diffusion length in photovoltaic crystalline silicon by modelisation of light beam induced current", Superlattices and Microstructures, 45 (2009), 393-401.
Schmidt et al., "Diameter-Dependent Growth Direction of Epitaxial Silicon Nanowires", Nano Letters, 2005, vol. 5, No. 5, 931-935.

(56) References Cited

OTHER PUBLICATIONS

Seibt et al., "Characterization of haze-forming precipitates in silicon", J. Appl. Physics, 1988, 63:4444-4450.
Shchetinin et al., "Photoconverters Based on Silicon-Crystal Whiskers", Translated from Izmeritarnaya Teknika, No. 4, pp. 35-36, 1978.
Shimizu et al., "Synthesis of Vertical High-Density Epitaxial Si(100) Nanowire Arrays on a Si(100) Substrate Using an Anodic Aluminum Oxide Template", Advanced Materials, 19, 917-920 (2007).
Shockley et al., "Detailed Balance Limit of Efficiency of p-n Junction Solar Cells", J. of Applied Physics, vol. 32, No. 3, 1961, 510-519.
Sivakov, V. et al., "Silicon Nanowire-Based Solar Cells on Glass: Synthesis, Optical Properties, and Cell Parameters", Nano Letters, 2009, vol. 9, No. 4, 1549-1554.
Spurgeon et al., "Repeated epitaxial growth and transfer of arrays of patterned, vertically aligned, crystalline Si wires from a single Si(111) substrate", Applied Physics Letters, 2008, 93:032112-1-032112-3.
Stelzner et al., "Silicon nanowire-based solar cells", Nanotechnology, 2008, 19:295203-1-295203-4.
Struthers, J.D., "Solubility and Difusivity of Gold, Iron, and Copper in Silicon", J. Appl. Phys, 27, 1956, p. 1560.
Sunden et al., "Microwave assisted patterning of vertically aligned carbon nanotubes onto polymer substrates", J. Vac. Sci. Technol. B 24(40 Jul./Aug. 2006, pp. 1947-1950.
Sze, M., "Physics of Semiconductor Devices", 2nd Edition, Wiley, New York, 1981, p. 21.
Takayama et al., "Topographical Micropatterning of Poly(dimethylsiloxane) Using Laminar Flows of Liquids in Capillaries", Advanced Materials, 2001, 13:570-574.
Thai, Luan C., Non-Final Office Action, U.S. Appl. No. 12/176,100, USPTO, Jan. 6, 2010.
Tian et al., "Coaxial silicon nanowires as solar cells and nanoelectronic power sources", Nature, 2007, 449:885-889.
Touskova et al., "Preparation and characterization of CdS/CdTe thin film solar cells", Thin Solid Films, 293 (1997) 272-276.
Tsakalakos et al., "Silicon nanowire solar cells", Applied Physics Letters, 91, 2007, 233117-1-233117-3.
Tsakalakos et al., "Strong broadband optical absorption in silicon nanowire films", J. of Nanophotonics, 2007, 1, 013552-1-013552-10.
Wagner et al., "Vapor-Liquid-Solid Mechanism of Single Crystal Growth", Applied Physics Letters, Mar. 1, 1964, vol. 4, No. 5, pp. 89-90.
Wagner et al., "The Vapor-Liquid-Solid Mechanism of Crystal Growth and Its Application to Silicon", Trans. Metal. Soc. AIME, 1965, 233 (6), 1053-1064.
Wagner et al., "Defects in Silicon Crystals Grown by the VLS Technique", J. of Applied Physics, vol. 38, No. 4, 1967, 1554-1560.
Wang et al., "Titania-nanotube-array-based photovoltaic cells", Appl. Phys. Lett, 89, 023508 (3 pages), 2006.
Westwater et al., "Control of the Size and Position of Silicon Nanowires Grown via the Vapor-Liquid-Solid Technique", Jpn. J. Appl. Phys., vol. 36 (1997) pp. 6204-6209.
Westwater et al., "Si Nanowires Grown via the Vapour-Liquid-Solid Reaction", Phys. Stat. Sol. (a) 165, 37-42 (1998).
Wolf et al., "Limitations and Possibilities for Improvement of Photovoltaic Solar Energy Converters" Part I: Considerations for Earth's Surface Operations, Proceedings of IRE, 1960, 48:1246-1263.
Wolfbauer, Georg, Communication Pursuant to Rule 70(2) and 70a(2) EPC, European Patent Application No. 08782075.9, Oct. 18, 2011.
Wolfbauer, Georg, Communication Pursuant to Article 94(3) EPC, European Patent Application No. 08782075.9, Mar. 5, 2014.
Woodruff et al., "Vertically Oriented Germanium Nanowires Grown from Gold Colloids on Silicon Substrates and Subsequent Gold Removal", Nano Letters, 2007, vol. 7, No. 6, 1637-1642.
Wu et al., "A Study on Deep Etching of Silicon Using Ethylene-Diamine-Pyrocatechol-Water", Sensors and Actuators, 9 (1986) 333-343.
Wu et al., "Semiconductor nanowire array: potential substrates for photocatalysis and photovoltaics", Topics in Catal., 2002, 19 (2), 197-202.
Xia et al., "One-Dimensional Nanostructures: Synthesis, Characterization, and Applications", Adv. Mater., 2003, 15(5), 353-389.
Yang et al., "Experimental Observation of an Extremely Dark Material by a Low-Density Nanotube Array", Nano Letters, 2008, vol. 8, No. 2, 446-451.
Yao et al., "Si nanowires synthesized with Cu catalyst", Materials Letters, 61 (2007), pp. 177-181.
Yoon et al., "Minority Carrier Lifetime and Radiation Damage Coefficients of Germanium", Conference Record of the Thirty-First IEEE, Photovoltaic Specialists Conference, Jan. 3-7, 2005, pp. 842-845.
Yoon et al., "Ultrathin silicon solar microcells for semitransparent, mechanically flexible and microconcentrator module designs", Nat. Mater., 2008, 7:907-915.

\* cited by examiner

THREE-DIMENSIONAL PATTERNING METHODS AND RELATED DEVICES

CROSS REFERENCE TO RELATED APPLICATIONS

The present application claims priority to U.S. provisional application 61/265,297 for "Selective p-n junction fabrication technique for high-aspect-ratio semiconductor microstructures" filed on Nov. 30, 2009, U.S. provisional application 61/265,306 for "Light-trapping Si wire-array structure for solar cells and photodetectors" filed on Nov. 30, 2009, and U.S. provisional application 61/313,654 for "Processing Steps for the Fabrication of a Microwire Array Solar Cell" filed on Mar. 12, 2010, all three of which are herein incorporated by reference in their entirety. The present application is also related to U.S. patent application Ser. No. 12/957,065 for "Semiconductor Wire Array Structures, and Solar Cells and Photodetectors Based on such Structures" filed on even date herewith, also incorporated herein by reference in its entirety.

STATEMENT OF GOVERNMENT GRANT

This invention was made with government support under Grant Numbers DE-SC0001293 and grant DE-FG02-07ER46405 awarded by the U.S. Department of Energy and Grant Number DMR0520565 awarded by the National Science Foundation. The US government has certain rights in the invention.

FIELD

The present disclosure relates to patterning methods for three-dimensional structures, such as semiconductor microstructures. Examples of these microstructures are semiconductor wire arrays, such as silicon (Si) wire arrays.

BACKGROUND

Solar cells based on arrays of Si micro- or nanowires have been proposed as a potentially low-cost alternative to conventional wafer-based Si solar cells. See reference [1], incorporated herein by reference in its entirety.

A large-area, solid-state, Si wire-array solar cell requires the formation of a radial or axial p-n junction within each wire. However, the formation or deposition of a monolithic p-n junction across the wire array (as suggested, for example, in reference [2], incorporated herein by reference in its entirety) is prone to shunting, as it provides no electrical isolation between adjacent wires and damaged areas of the array or substrate. Furthermore, a radial junction that extends to the bottom of each wire would greatly complicate the formation of backside electrical contacts to a polymer-embedded, peeled-off wire array. This is because a non-selective contact to the bottom of each wire would contact both the n- and p-type regions, effectively shunting the junction.

SUMMARY

According to a first aspect of the disclosure, a method for selectively patterning a three-dimensional structure comprising a plurality of spaced elements is provided, comprising: embedding a portion of the three-dimensional structure with a material filling a space within the elements, the material defining an embedded portion of the three-dimensional structure and an unembedded portion of the three-dimensional structure, thus defining, for each element, an embedded portion of the element and an unembedded portion of the element; and patterning the unembedded portions of the elements, thus selectively patterning the three-dimensional structure.

According to a second aspect of the disclosure, a method for forming radial and axial junctions in a silicon microscale or nanoscale wire array is provided, comprising: providing a silicon wire array; doping the silicon wire array with a first type of dopant; covering the silicon wire array with oxide to form an oxide covered silicon wire array; applying a polymer to the oxide covered silicon wire array; forming on each wire a first region where the wire is covered with the oxide and the polymer, and a second region where the wire and oxide are exposed; removing the exposed oxide from the second region without removing the polymer protected oxide from the first region; removing the polymer; and doping the second regions of the silicon wire array with a second type of dopant different from the first type of dopant, forming radial junctions between the first type of dopant in the second region and the second type of dopant in the second region of the wires.

According to a third aspect of the disclosure, a silicon microscale or nanoscale wire solar cell is provided, comprising: a plurality of aligned microscale or nanoscale wires embedded into polymer; a plurality of light scattering particles embedded into the polymer between the wires; a first contact; and a second contact, the second contact acting as a back reflector.

Further embodiments of the disclosure are provided in the specification, drawings and claims of the present application.

Appendix 1, Appendix 2, and Appendix 3 are filed together with the present application and form integral part of the specification of the present application.

DETAILED DESCRIPTION

Embodiments of the present disclosure are directed to a three-dimensional (3-D) non-photolithographic patterning method that utilizes a polymeric infill (e.g. PDMS infill) of a 3-D microstructure (e.g. semiconductor wire arrays) in conjunction with etching and/or deposition steps to pattern the 3-D microstructure.

By way of example, this method can be used to form radial p-n junctions in Si micro-wires for photovoltaic applications as shown in FIGS. 1-4.

Figure 1:
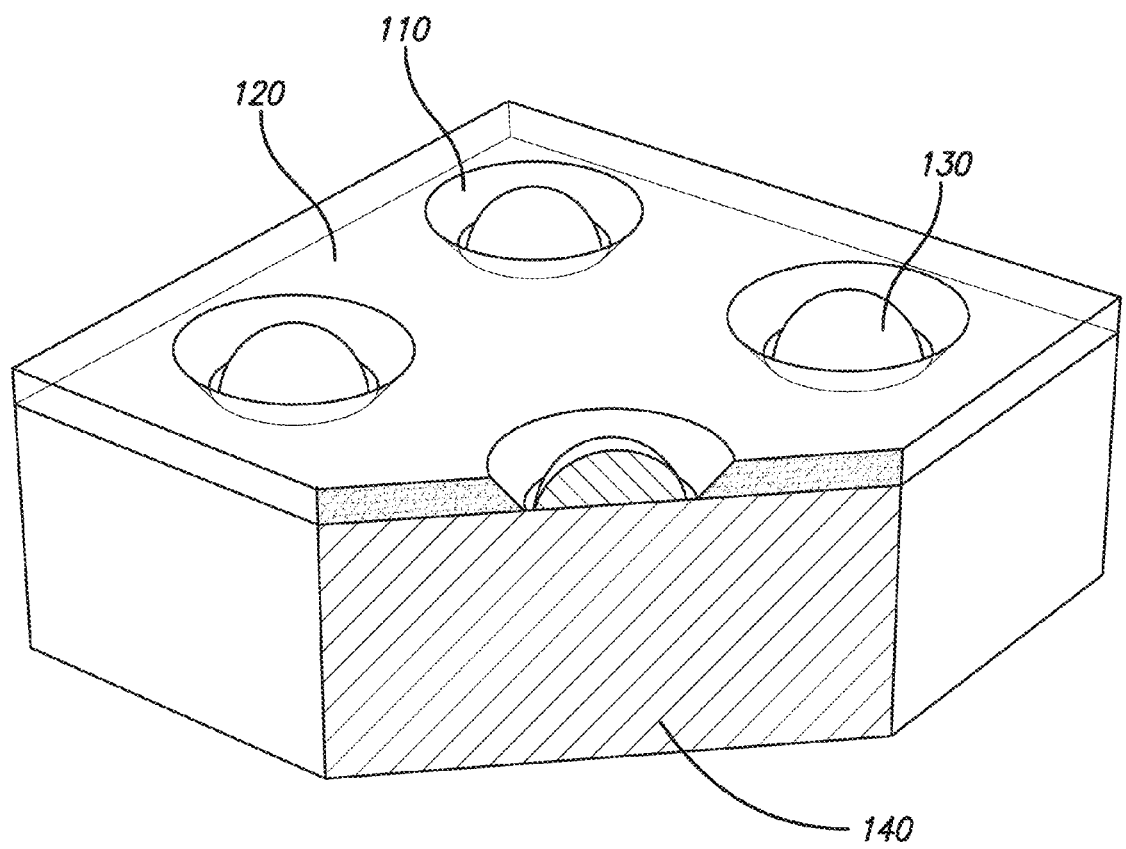
FIG. 1 shows a schematic partial cross sectional view of photolithographically patterned catalyst particles prior to growth.
Figure 2:
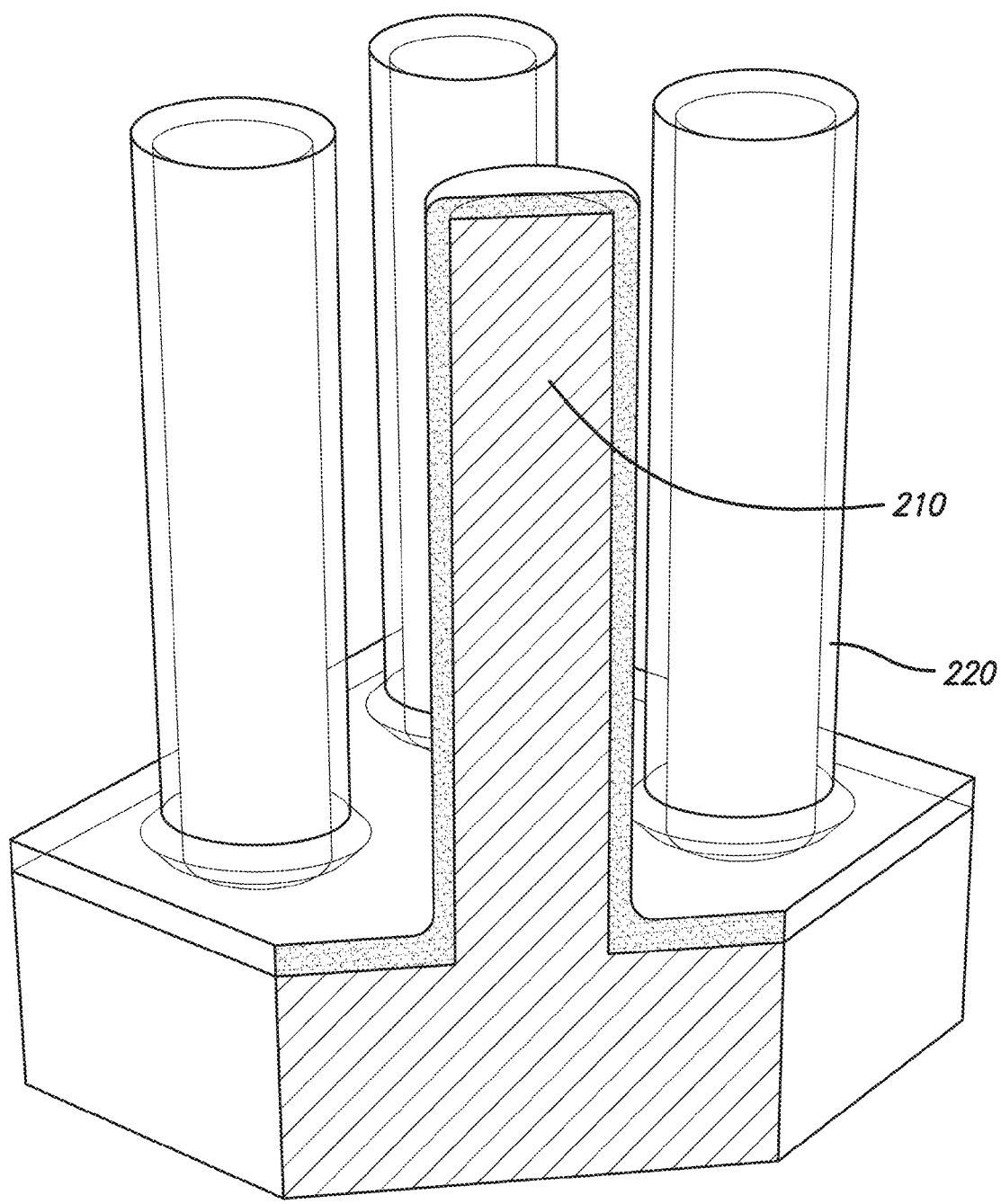
FIG. 2 shows a schematic partial cross sectional view of a microscale or nanoscale wire array following VLS (vapor-liquid-solid) growth, catalyst removal, and thermal-oxide diffusion-barrier formation.

FIGS. 1-2 show wire growth by a photolithographically patterned VLS technique, as described in reference [3], incorporated herein by reference in its entirety.

A wire array is initially defined. FIG. 1 shows photolithographically patterned catalyst particles prior to growth. A photolithographically patterned hole array (110) covered by buffer oxide (120) contains a plurality of holes where catalyst particles (e.g., Cu particles) (130) are located. The patterned hole array (110) is located on a substrate (140), e.g. a p+Si <111> wafer.

Wire array growth and processing are then performed. FIG. 2 shows a wire array after catalyst removal (by using, e.g., a chemical etch), where p-type doping (210) can be achieved in-situ by the introduction of $BCl_3$ during growth (see reference [4], incorporated herein by reference in its entirety) and where thermal oxidation is performed to form a conformal phosphorus diffusion barrier (220) (e.g., a 200 nm thick $SiO_2$ layer) around the wire and substrate surfaces. In case n-doping is desired, $PH_3$ can be flown instead of $BCl_3$. The resulting structure comprises an array of wires, such as elongated semiconductor elements, which, by way of example and not of limitation, is a square-tiled array of 67-μm-long Si wires. In some embodiments, the elongated semiconductor elements have diameters of at least 1 microns, lengths of at least 20 microns or more and length to diameter ratios of at least 5.

Figure 3:
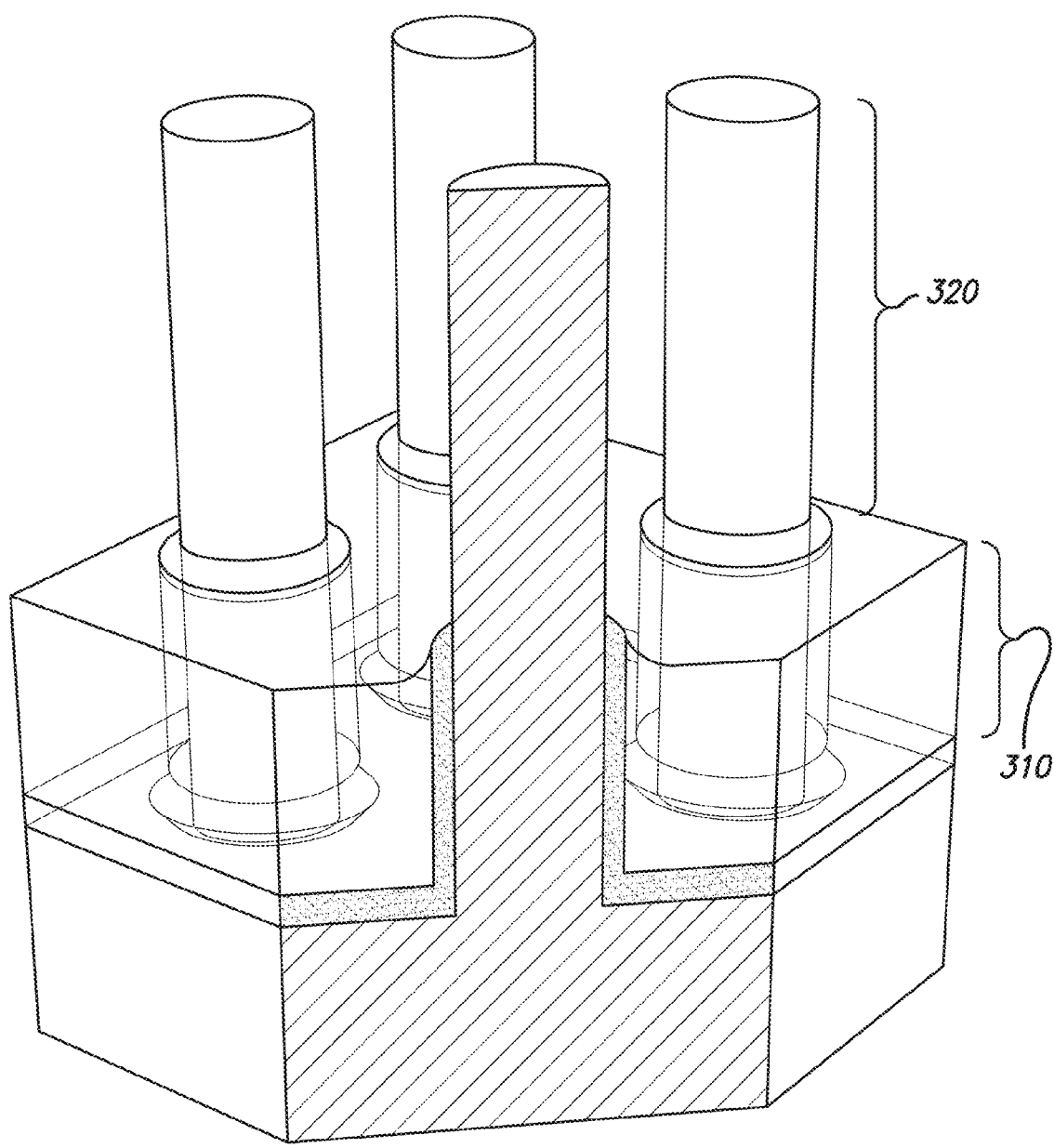
FIG. 3 shows a schematic partial cross sectional view of wire array after formation of a PDMS (polydimethylsiloxane) mask layer and selective removal of a thermal oxide diffusion barrier.

With reference now to FIG. 3, a polymer, e.g. PDMS, is then applied to the wire array. For example, PDMS can be diluted with a low-boiling-point solution of hexamethyltrisiloxane dissolved in dichloromethane and applied to the wire array by spin coating. The controlled evaporation of the low-boiling-point solution results in a uniform contraction of the PDMS infill, yielding a polymer layer (310) at the base of the array, as shown in FIG. 3, e.g. a roughly 15 μm-thick layer after curing at 120° C.

The thickness of mask layer (310) can be varied by adjusting the ratio of PDMS to the low-boiling-point solution, or by sequential application and curing of diluted PDMS layers. Control of the thickness of the mask layer (310) allows control of the height of the conformal thermal oxide coating after chemical etching (i.e., the phosphorous diffusion barrier in the example at issue).

In order to remove any residual polymer from the wire sidewalls above the mask layer (310), the wire array is etched. For example, a 2 second etch of 1:1 dimethylformamide (DMF): tetrabutylammonium fluoride (TBAF) can be used.

The thermal oxide (220) not covered by the polymer mask (310) is then removed, e.g. chemically removed using buffered hydrofluoric acid (BHF), selectively exposing Si surfaces (320) at the top and sides of each wire. The cured mask layer (310) prevents the etching of the oxide at the bases of the wires.

The polymer mask layer (310) is then removed. Such removal can be obtained, for example, by etching in a PDMS etch, 3:1 DMF:TBAF for 10-30 minutes. The wire array can then be etched to remove residual organic contaminants, for example in 1:1 sulfuric acid:hydrogen peroxide for 1-5 minutes. Native oxide from the exposed Si surfaces can also be removed, for example by etching in 10% HF for 10 seconds.

Figure 4:
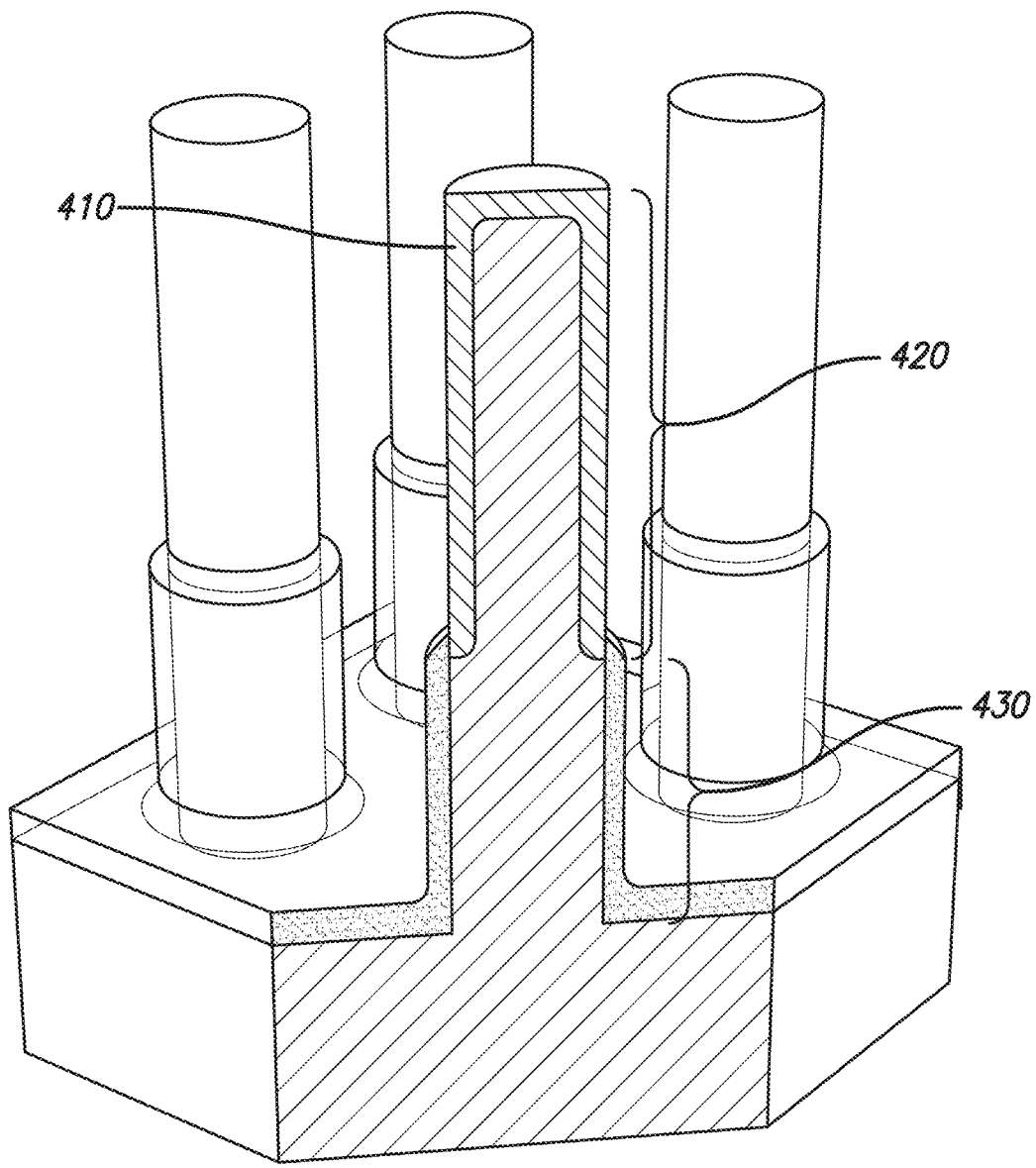
FIG. 4 shows a schematic partial cross sectional view of wire array following selective p-n junction diffusion. The height of the diffusion-barrier determines the extent of axial (masked) vs. radial (unmasked) junction formation. Independent p-n junctions within each wire of the array are formed.

N-type regions (410), e.g. emitter regions, beneath the non-masked areas of the wire sidewalls are produced, as shown in FIG. 4. These regions can be produced, for example, by way of a thermal phosphorous diffusion at 850° C. for 5 minutes. The thermal oxide (e.g., $SiO_2$) functions as a phosphorous diffusion barrier for the lower region of the wires. The temperature and duration of the diffusion step can be adjusted, if desired, to achieve a desired doping profile and junction depth. In order to remove diffusion glass from the wire sidewalls while leaving the oxide diffusion barrier intact, a 10 second buffered HF etch can be performed. Should p-type regions be produced on n-doped silicon wires, they can be produced by diffusing B (boron) into the Si wires from BN (Boron Nitride) source wafers.

As shown in FIG. 4, both radial junctions (420) and quasi-axial junctions (430) are formed. Therefore, radial, axial and/or a combination of radial and axial p-n or n-p junctions can be used with such arrangement.

Formation of metal contacts with the wires formed in accordance with the above described method can be obtained by using, for example, the photolithographically aligned metallization technique described in reference [4].

Figure 5A:
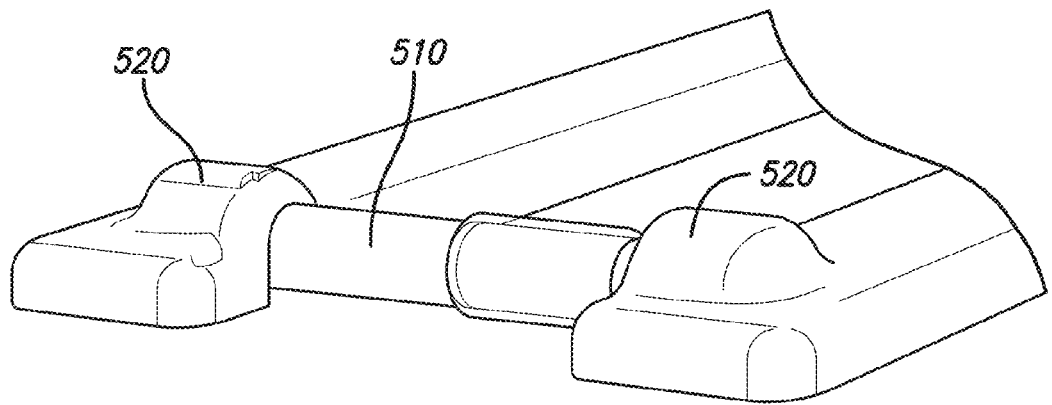
FIGS. 5A and 5B show perspective and cross sectional views of a single-wire solar cell device.

FIG. 5A shows a perspective view of a wire (510) formed in accordance with the above described method, connected to ohmic contacts (520). The ohmic contacts can be achieved using evaporated Al, with Ag evaporated onto the Al to supplement the total metal thickness, and to allow wire bonding to the contact pads.

Figure 5B:
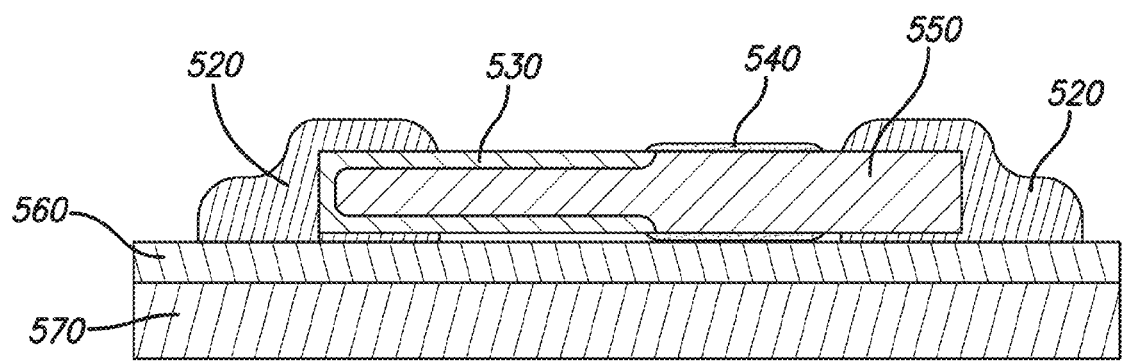

A more detailed view of the arrangement of FIG. 5A is shown in the cross sectional view of FIG. 5B, where the diffused emitter (530), the thermal oxide (540), and the Si core (550) are shown. If region (530) is an n-type region then the Si core (550) is a p-type Si core and vice versa.

While FIGS. 5A and 5B show a single contact (520) to either end of the wire, a plurality of contacts can be provided, if desired, to each end.

The arrangement of FIGS. 5A and 5B can be used to form a single wire solar cell. In this respect, FIG. 5B shows an antireflection (AR) $Si_3N_4$ layer (560) on top of a substrate (570), e.g. an n+Si substrate.

The I-V characteristics of the single-wire device are described in FIGS. 12 and 13 and related portions of the specification of the U.S. provisional application 61/265,297 to which the present application claims priority, and are incorporated herein by reference.

Surface passivation on the wires obtained according to the method of the present disclosure can be achieved using conformally deposited a-Si:H to decrease surface recombination at the wire sidewalls. Surface passivation prevents photo-excited carriers from recombining at the wire surface, thereby allowing the photo-excited carriers to travel to the metal contacts where they can be used to perform an electrical function.

Wires are first etched for 7 minutes in BHF to remove all surface oxide, then loaded into a plasma-enhanced chemical vapor deposition (PECVD) chamber for deposition of an about 10 nm-thick layer of nominally undoped a-Si:H on the wire sidewalls.

Further observation, verification and results of surface passivation are described in FIGS. 14 and 15 and the section 'Surface passivation' of the specification of the U.S. provisional application 61/265,297 to which the present application claims priority, and are incorporated herein by reference.

As already mentioned in the introductory paragraph of the present application, the present application is also related to U.S. patent application Ser. No. 12/957,065 for "Semiconductor Wire Array Structures, and Solar Cells and Photodetectors Based on such Structures" filed on even date herewith, incorporated herein by reference in its entirety, and claiming priority to the same US provisional applications of the present application. U.S. patent application Ser. No. 12/957,065 describes solar cells and photodetectors comprised of a wire array with anti-reflective coatings on the wire surfaces, light scattering $Al_2O_3$ particles within the wire array and a back reflector behind the wire array.

Figure 6:
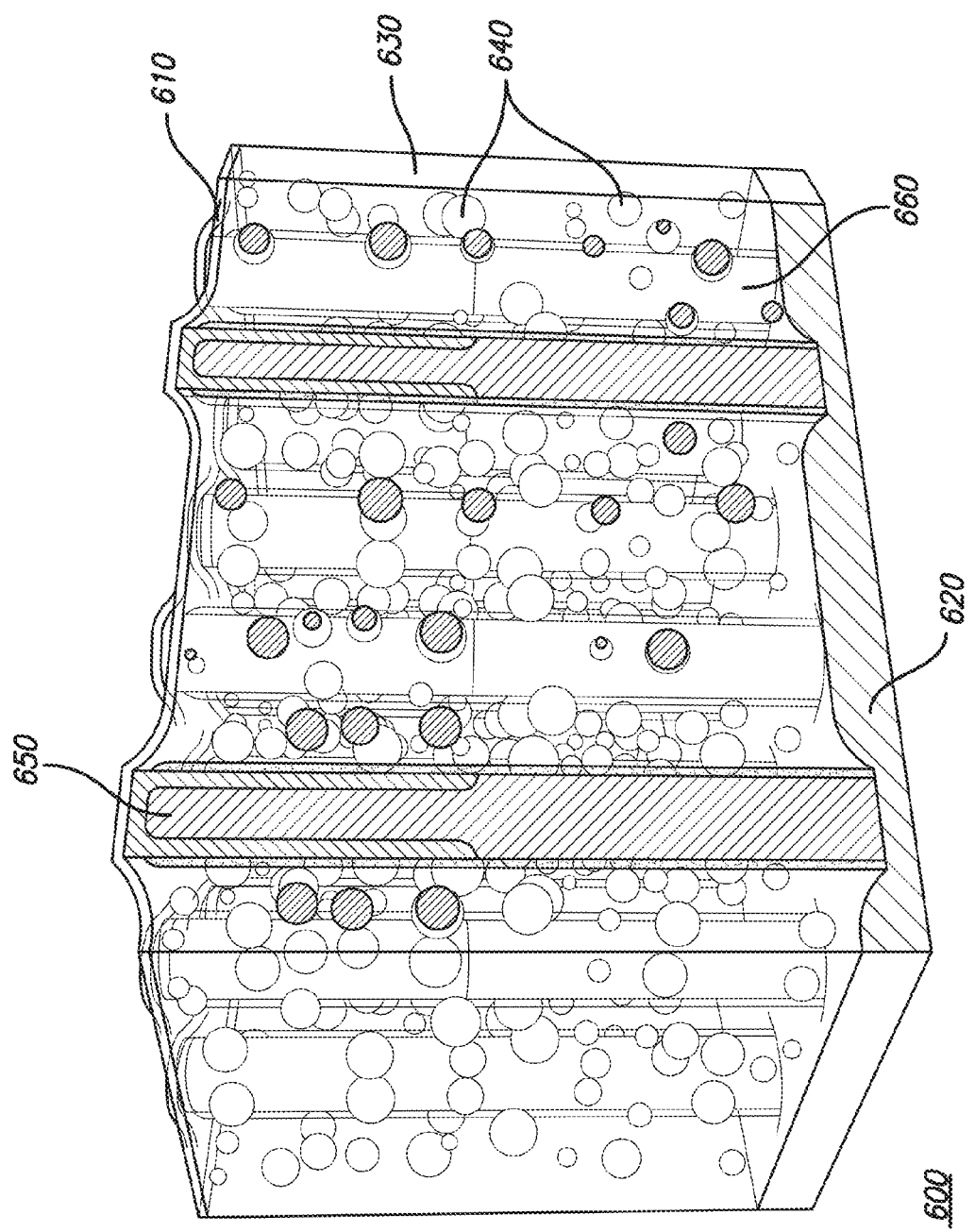
FIG. 6 shows a perspective view of a solar cell device according to a further embodiment of the present disclosure.

FIG. 6 of the present application describes an embodiment where the teachings of the present disclosure are combined with the teachings of U.S. patent application Ser. No. 12/957,065. In particular, shown in FIG. 6 is a Si wire array solar cell (600) with a transparent top contact (610) (e.g. an indium tin oxide (ITO) contact) and a metallic bottom contact (620) acting as a back reflector. Solar cell (600) is embedded into a polymer encasing or environment (630), e.g. a flexible transparent polymer such as PDMS. Light scattering particles (640) (e.g., $Al_2O_3$ particles) are embedded inside the environment (630). The solar cell (600) further comprises an array of mechanically flexible vertically aligned wires (650) as previously shown in FIG. 4. The wires (650) are coated with a surface passivation antireflective coating (660).

If desired, both contacts can be placed at the bottom of the solar cell, with one of the acting as a back reflector.

While some of the above embodiments have described methods to form radial p-n junctions in Si microscale or nanoscale wires, further embodiments applying the teachings of the present disclosure can be provided.

Figure 7A:
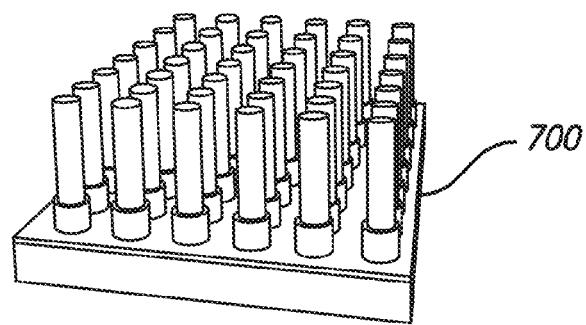
FIGS. 7A-7E show patterning steps according to an embodiment of the disclosure.
Figure 7B:
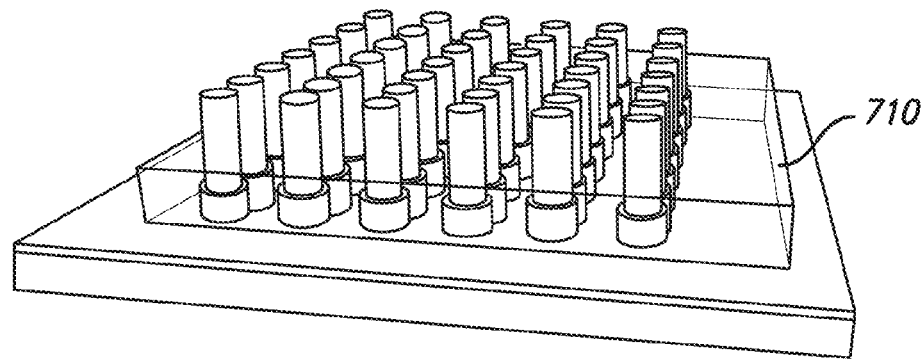
Figure 7C:
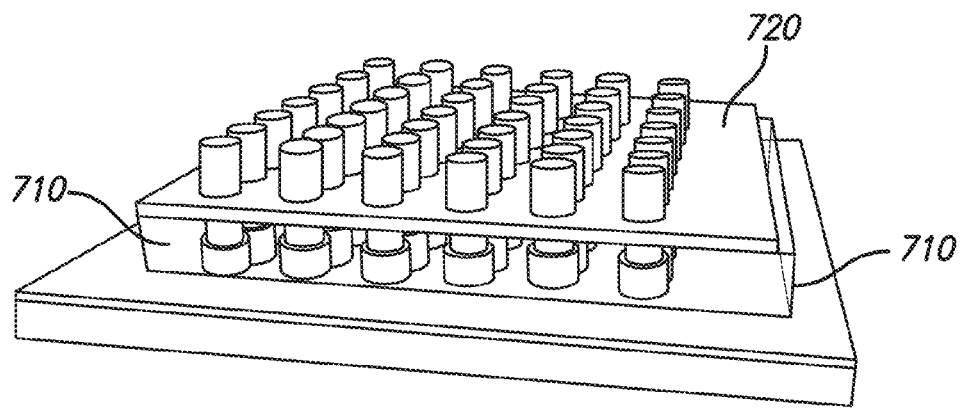
Figure 7D:
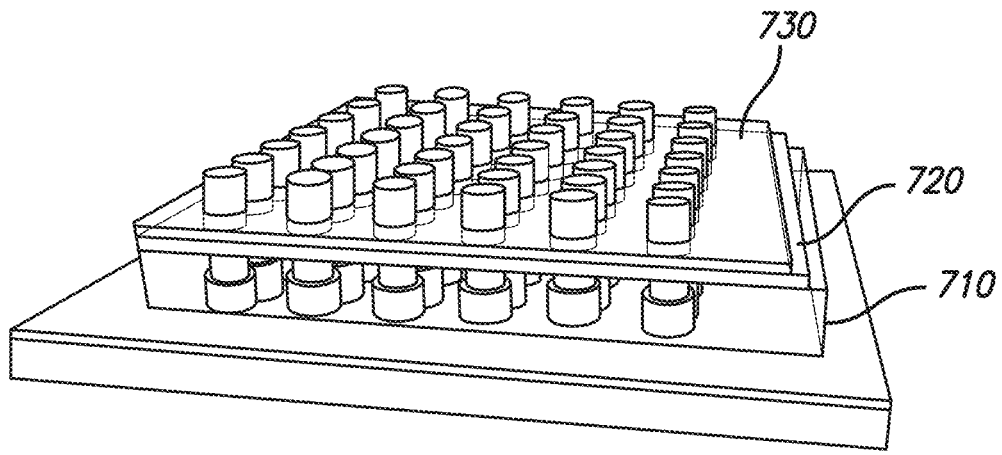
Figure 7E:
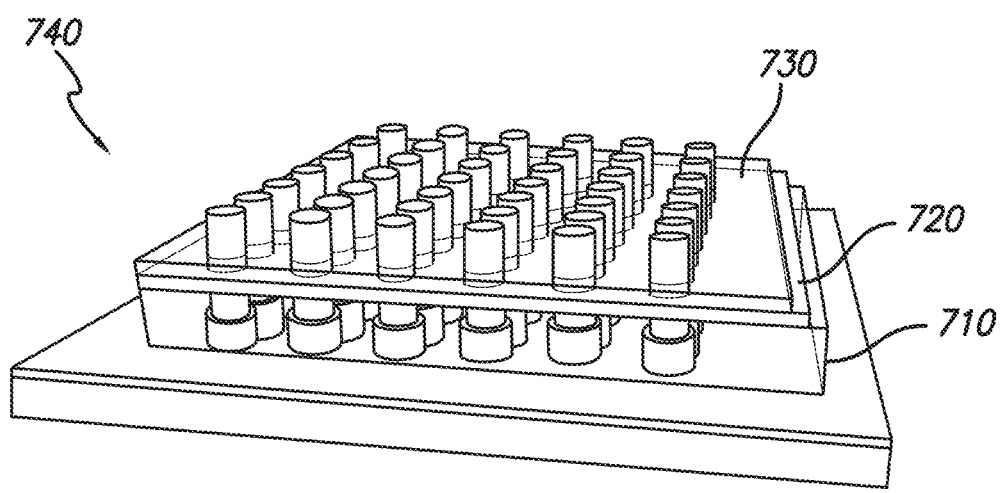

FIGS. 7A-7E show a further example of a patterning method according to the present disclosure. In particular, FIG. 7A shows a 3-D micro- or nanostructure (700). As shown in FIG. 7B, a polymer (e.g. PDMS) (710) is used to protect or isolate a portion of the 3-D microstructure, in this case the base of the wire array. A material (e.g. Al) (720) is then deposed on the portion of the 3-D micro- or nanostructure not isolated by the polymer (710), as shown in FIG. 7C. Therefore, the presence of the polymer layer (710) allows selective deposition of the material (720) on the 3-D structure (700). A further layer of polymer (730) is then placed as shown in FIGS. 7D and 7E, and then a chemical etch is used to selectively remove the material (740) (Al in the example of the figure) from the portion of the structure above the second layer of polymer (730), thus allowing a desired patterning of the structure (700).

In addition to not suffering the small parasitic absorption losses of a transparent top contact, the embedded Al contact is likely to be a more robust and flexible contact and serves the additional role of a metallic back reflector.

According to a further embodiment of the present disclosure, the patterning method can also be used to produce selective openings in dielectric (electrically insulating) passivation and/or anti-reflection layers on Si wires in order to allow for electrical contacting of the Si wires. In other words, a 3-D structure of Si wires coated with passivation and/or anti-reflection layers is initially provided. A layer of thermoplastic wax is then deposited on a bottom portion of the coated Si wires, similarly to what was previously shown in FIG. 7B, leaving a top portion of the coated Si wires exposed. Selective deposition of the thermoplastic wax can occur, for example, by melting the wax into the wire array and then etching the wax to the desired height using an oxygen plasma. In a further step, the passivation and/or anti-reflective layer is then etched away from the top portion, thus allowing contact opening through selective chemical etching.

Figure 8:
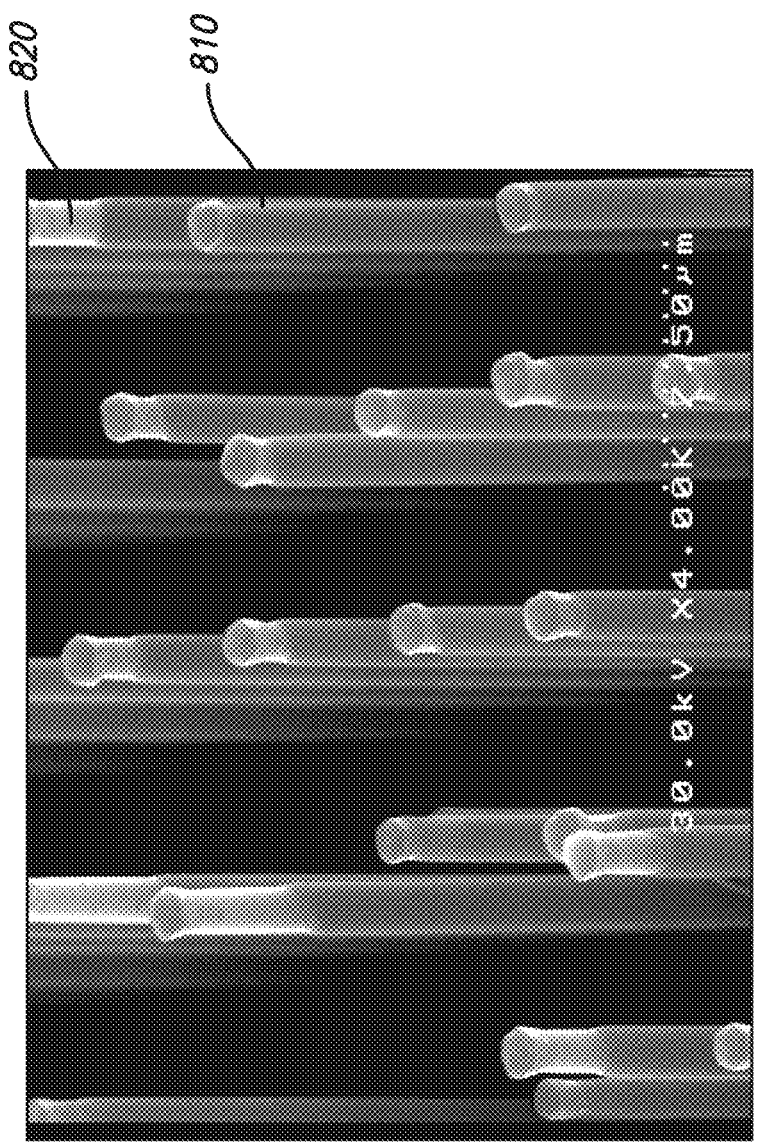
FIG. 8 shows a scanning electron microscope (SEM) image of a plurality of coated Si wires with an exposed Si top portion.

FIG. 8 shows a scanning electron microscope (SEM) image of a plurality of ($\alpha$-$SiN_x$:H) coated Si wires (810) with an exposed Si top portion (820). Such embodiment can be useful for wire-array solar cells, which usually are not able to survive the high-temperature (>500° C.) conditions currently used for contact fire-through.

According to further embodiments of the disclosure, the patterning can comprise application of a functional coating (e.g., a methyl termination), depositing a semiconductor (e.g., amorphous silicon), and/or depositing an insulator (e.g., silicon nitride) on the top portion of the wires. The patterning can also comprise, if desired, adding a functional element to the space between the top regions or portions of the wires. By way of example, dielectric scattering particles can be added, followed by an infilling with polymer and inversion of the structure, in order to obtain a polymer embedded Si wire array with dielectric scattering particles located only at a base of the wire array. Such structure would minimize or eliminate reflection losses that would occur if dielectric scattering particles were located at the top of the wire array.

The examples set forth above are provided to give those of ordinary skill in the art a complete disclosure and description of how to make and use the embodiments of the selective p-n junction fabrication for semiconductor microstructures and related methods and devices of the disclosure, and are not intended to limit the scope of what the inventors regard as their disclosure. Modifications of the above-described modes for carrying out the disclosure may be used by persons of skill in the art, and are intended to be within the scope of the following claims. For example, the person skilled in the art will understand, upon reading of the present disclosure, that any type of three-dimensional structure is suited to undergo the steps of the method according to the present disclosure. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

LIST OF CITED REFERENCES

[1] Kayes, B. M., Atwater, H. A. & Lewis, N. S. Comparison of the device physics principles of planar and radial p-n junction nanorod solar cells. J. Appl. Phys. 97, 114302-114311 (2005)

[2] Kelzenberg, M. D. et al. Single-nanowire Si solar cells. 33rd IEEE Photovoltaic Specialists Conference 1-6 (2008)

[3] Kayes, B. M. et al. Growth of vertically aligned Si wire arrays over large areas (>1 cm2) with Au and Cu catalysts. Appl. Phys. Lett. 91, 103110-103113 (2007)

[4] Putnam, M. C. et al. 10 μm minority-carrier diffusion lengths in Si wires synthesized by Cu-catalyzed vapor-liquid-solid growth. Appl. Phys. Lett. 95, 163116-163113 (2009)

[5] Yablonovitch, E., Allara, D. L., Chang, C. C., Gmitter, T. & Bright, T. B. Unusually low surface-recombination velocity on silicon and germanium surfaces. Phys. Rev. Lett. 57, 249 (1986)

The invention claimed is:

1. A silicon microscale wire solar cell, comprising:
    a plurality of aligned microscale wires,
        each of the plurality of aligned microscale wires having a length with a first portion and a second portion,
        the first portion of the length having a cladding portion on a core portion,
            the core portion doped with a first type of dopant and the cladding portion doped with a second type of dopant,
            the core portion and the cladding portion defining a radial junction in the first portion of the length, and
            the second portion of the length being doped with the first type of dopant but excluding the second type of dopant;
    dopant barriers that are each on a different one of the wires such that each barrier is on the second portion of the length without being positioned on the first portion of the length; and
        the second portion of the length being embedded in a polymer;
    a plurality of light scattering particles embedded into the polymer and between the wires;
    a first electrical contact in electrical communication with the first portion of the length for each of the wires; and
    a second electrical contact in electrical communication with the second portion of the length for each of the wires, the second contact acting as a back reflector.

2. The solar cell of claim 1, wherein the first electrical contact is on a top side of the wires and the second electrical contact is on a bottom side of the wires or vice versa.

3. The solar cell of claim 1, wherein the first electrical contact and the second electrical contact are on a same side of the wires.

4. The solar cell of claim 3, wherein the same side is a bottom side of the wires.

5. The solar cell of claim 1, wherein the light scattering particles are $Al_2O_3$ particles.

6. The solar cell of claim 1, wherein the polymer is PDMS.

7. The solar cell of claim 1, wherein the first electrical contact is a transparent contact made of indium tin oxide.

8. The solar cell of claim 1, wherein the second portion of the length exludes radial junctions.

9. The solar cell of claim 1, wherein the first type of dopant and the second second type of dopant are selected such that the radial junction is a p-n junction.

10. The solar cell of claim 1, wherein each cladding portion surrounds one of the core portions.

11. The solar cell of claim 1, wherein each dopant barrier surrounds the second portion of the length of one of the wires.

12. The solar cell of claim 1, wherein the dopant barriers are an oxide.

13. The solar cell of claim 1, wherein the dopant barriers are $SiO_2$.

14. The solar cell of claim 12, wherein the polymer surrounds the dopant barriers.

15. The solar cell of claim 1, wherein the barriers are each on a third portion of the length of one of the wires,
    the third portion of the length including the first type of dopant and the second type of dopant, and
    the third portion of the length contacting the first portion of the length and the second portion of the length.

16. The solar cell of claim 1, wherein the wires extend upward from a substrate such that the each wire has the second portion of the length between the substrate and the first portion of the length, and
    the second portion of the length of each wire is in direct physical contact with the substrate.

17. The solar cell of claim 16, wherein the second portion of the length of each wire is continuous with the substrate.

18. The solar cell of claim 1, wherein the first type of dopant is the only type of dopant included in the second portion of the length of each wire.

19. The solar cell of claim 1, wherein the first portion of the length of each wire intersects one of the second portions of the length such that a perimeter of the first portion of the length is flush with a perimeter of the second portion of the length at the intersection.

20. The solar cell of claim 1, wherein each second portion of the length and one of the cladding portions defines an axial junction.

21. The solar cell of claim 1, wherein the wires have diameters of at least 1 micron with an aspect ratio greater than 5.

* * * * *